(12) United States Patent
Lee et al.

(10) Patent No.: US 11,239,327 B2
(45) Date of Patent: Feb. 1, 2022

(54) HEMT AND METHOD OF ADJUSTING ELECTRON DENSITY OF 2DEG

(71) Applicant: UNITED MICROELECTRONICS CORP., Hsin-Chu (TW)

(72) Inventors: Kai-Lin Lee, Kinmen County (TW); Zhi-Cheng Lee, Tainan (TW); Wei-Jen Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 50 days.

(21) Appl. No.: 16/513,699

(22) Filed: Jul. 16, 2019

(65) Prior Publication Data
US 2020/0411649 A1    Dec. 31, 2020

(30) Foreign Application Priority Data

Jun. 25, 2019 (CN) .......................... 201910553143.8

(51) Int. Cl.
| | |
|---|---|
| *H01L 29/40* | (2006.01) |
| *H01L 21/02* | (2006.01) |
| *H01L 29/20* | (2006.01) |
| *H01L 29/205* | (2006.01) |

(Continued)

(52) U.S. Cl.
CPC ........ *H01L 29/408* (2013.01); *H01L 21/0217* (2013.01); *H01L 21/02164* (2013.01); *H01L 21/02271* (2013.01); *H01L 29/2003* (2013.01); *H01L 29/205* (2013.01); *H01L 29/66462* (2013.01); *H01L 29/7786* (2013.01)

(58) Field of Classification Search
CPC . H01L 29/408; H01L 29/2003; H01L 29/205; H01L 29/66462; H01L 21/02164; H01L 21/0217; H01L 21/02271; H01L 29/7786; H01L 29/7787; H01L 21/02617; H01L 29/1054; H01L 29/4236; H01L 29/0661; H01L 29/10; H01L 29/207; H01L 29/6646

USPC ............ 257/201, 615, 194, 76, 330, E21.09, 257/E29.089, E29.091; 438/478, 172

See application file for complete search history.

(56) References Cited

U.S. PATENT DOCUMENTS

| | | | |
|---|---|---|---|
| 8,587,032 B2 | 11/2013 | Jung | |
| 2006/0220065 A1* | 10/2006 | Kawasaki | ......... H01L 29/66462 257/200 |
| 2009/0230331 A1 | 9/2009 | Koudymov | |

(Continued)

FOREIGN PATENT DOCUMENTS

| | | |
|---|---|---|
| WO | 2017/200827 | 11/2017 |
| WO | 2018004660 | 1/2018 |

*Primary Examiner* — Mouloucoulaye Inoussa
(74) *Attorney, Agent, or Firm* — Winston Hsu

(57) ABSTRACT

A high electron mobility transistor (HEMT) includes a gallium nitride layer. An aluminum gallium nitride layer is disposed on the gallium nitride layer, wherein the aluminum gallium nitride layer comprises a tensile stress. A source electrode and a drain electrode are disposed on the aluminum gallium nitride layer. A gate electrode is disposed on the aluminum gallium nitride layer between the source electrode and the drain electrode. At least one silicon oxide layer is embedded in the aluminum gallium nitride layer, wherein the silicon oxide layer is formed by a flowable chemical vapor deposition, and the silicon oxide layer increases the tensile stress in the aluminum gallium nitride layer.

19 Claims, 5 Drawing Sheets

(51) Int. Cl.
*H01L 29/66* (2006.01)
*H01L 29/778* (2006.01)

(56) References Cited

U.S. PATENT DOCUMENTS

| | | | | |
|---|---|---|---|---|
| 2011/0254057 | A1* | 10/2011 | Jeon | H01L 29/7787 |
| | | | | 257/201 |
| 2013/0134435 | A1* | 5/2013 | Yu | H01L 21/321 |
| | | | | 257/76 |
| 2014/0335666 | A1 | 11/2014 | Koehler | |
| 2015/0061028 | A1* | 3/2015 | He | H01L 21/823807 |
| | | | | 257/369 |
| 2016/0293505 | A1* | 10/2016 | Ghassemi | H01L 22/32 |

* cited by examiner

HEMT AND METHOD OF ADJUSTING ELECTRON DENSITY OF 2DEG

BACKGROUND OF THE INVENTION

1. Field of the Invention

The present invention relates to a high electron mobility transistor (HEMT), and more particularly to an HEMT which includes a silicon oxide layer or a stressor embedded within an aluminum gallium nitride layer.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different band-gaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity.

A two-dimensional electron gas (2DEG) may be generated by the piezoelectricity property of the GaN-based materials, and the switching velocity may be enhanced because of the higher electron velocity and the higher electron density of the 2DEG As semiconductor devices are upgraded, however, the speed of the HEMTs needs to be increased. Moreover, because the HEMTs often work at high voltage, their ability to sustain voltage should be increased as well.

SUMMARY OF THE INVENTION

It is one of the objectives of the present invention to provide a method which increases both the speed and voltage sustain ability of an HEMT.

According to a preferred embodiment of the present invention, an HEMT includes a gallium nitride layer, and an aluminum gallium nitride layer disposed on the gallium nitride layer, wherein the aluminum gallium nitride layer comprises a tensile stress. A source electrode and a drain electrode are disposed on the aluminum gallium nitride layer. A gate electrode is disposed on the aluminum gallium nitride layer between the source electrode and the drain electrode. At least one silicon oxide layer is embedded in the aluminum gallium nitride layer, wherein the silicon oxide layer is formed by a flowable chemical vapor deposition, and the silicon oxide layer increases the tensile stress in the aluminum gallium nitride layer.

According to another preferred embodiment of the present invention, an HEMT includes a gallium nitride layer, and an aluminum gallium nitride layer disposed on the gallium nitride layer, wherein the aluminum gallium nitride layer includes a tensile stress. A source electrode and a drain electrode are disposed on the aluminum gallium nitride layer. A gate electrode is disposed on the aluminum gallium nitride layer between the source electrode and the drain electrode. At least one stressor is embedded in the aluminum gallium nitride layer, wherein the stressor decreases the tensile stress in the aluminum gallium nitride layer.

A method of adjusting an electron density of a 2DEG includes providing a gallium nitride layer and an aluminum gallium nitride layer, wherein the aluminum gallium nitride layer contacts the gallium nitride layer, a source electrode, a drain electrode, and a gate electrode are disposed on the aluminum gallium nitride layer, the aluminum gallium nitride layer includes a tensile stress, and a 2DEG is formed within the gallium nitride layer. Next, a step A or a step B is performed. Step A includes forming at least one silicon oxide layer to embed in the aluminum gallium nitride layer, wherein the silicon oxide layer is formed by a flowable chemical vapor deposition, the silicon oxide layer increases the tensile stress in the aluminum gallium nitride layer and increases an electron density of the 2DEG Step B includes forming at least one stressor to embed in the aluminum gallium nitride layer, wherein the stressor decreases the tensile stress in the aluminum gallium nitride layer and decreases the electron density of the 2DEG These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a method of adjusting an electron density of a 2DEG according to a first embodiment of the present invention, wherein:

FIG. 1 depicts a stage of providing a gallium nitride layer and an aluminum gallium nitride layer;

FIG. 2 is a method following FIG. 1;

FIG. 3 is a method following FIG. 2; and

FIG. 4 is a method following FIG. 3.

FIG. 5 to FIG. 6 depict a method of adjusting an electron density of a 2DEG according to an another embodiment of the present invention, wherein:

FIG. 5 is a method following FIG. 1; and

FIG. 6 is a method following FIG. 5.

FIG. 7 to FIG. 9 depict a method of adjusting an electron density of a 2DEG according to another preferred embodiment of the present invention, wherein:

FIG. 7 is a modification of FIG. 4;

FIG. 8 is a modification of FIG. 6; and

FIG. 9 is another modification of FIG. 6.

DETAILED DESCRIPTION

Figure 1:
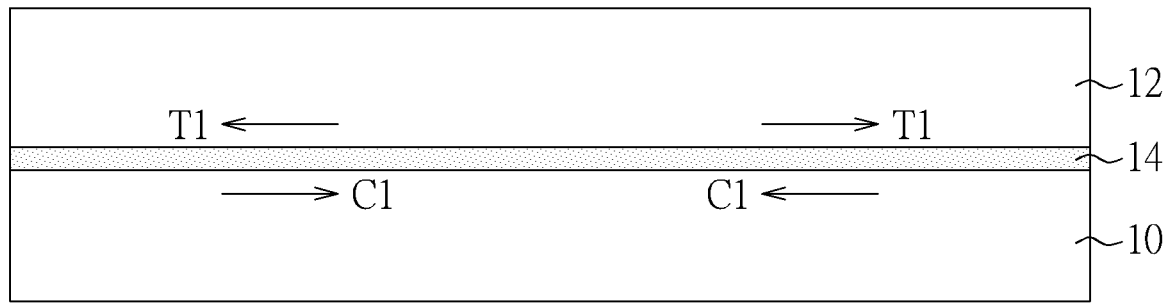

FIG. 1 to FIG. 4 depict a method of adjusting an electron density of a 2DEG according to a first embodiment of the present invention. As shown in FIG. 1, a gallium nitride (GaN) layer 10 is provided. Next, an aluminum gallium nitride ($Al_xGa_{1-x}N$) layer 12 covers and contacts the gallium nitride layer 10. The gallium nitride layer 10 and the aluminum gallium nitride layer 12 can be formed by epitaxial processes. Because the sizes of the lattice of the gallium nitride layer 10 and the aluminum gallium nitride layer 12 are different, a tensile stress T1 is formed in the aluminum gallium nitride layer 12, and a compressive stress C1 is formed in the gallium nitride layer 10 after the aluminum gallium nitride layer 12 contacts the gallium nitride layer 10. Moreover, piezoelectricity formed between the gallium nitride layer 10 and the aluminum gallium nitride layer 12 and a 2DEG 14 is formed in the gallium nitride layer 10.

Figure 2:
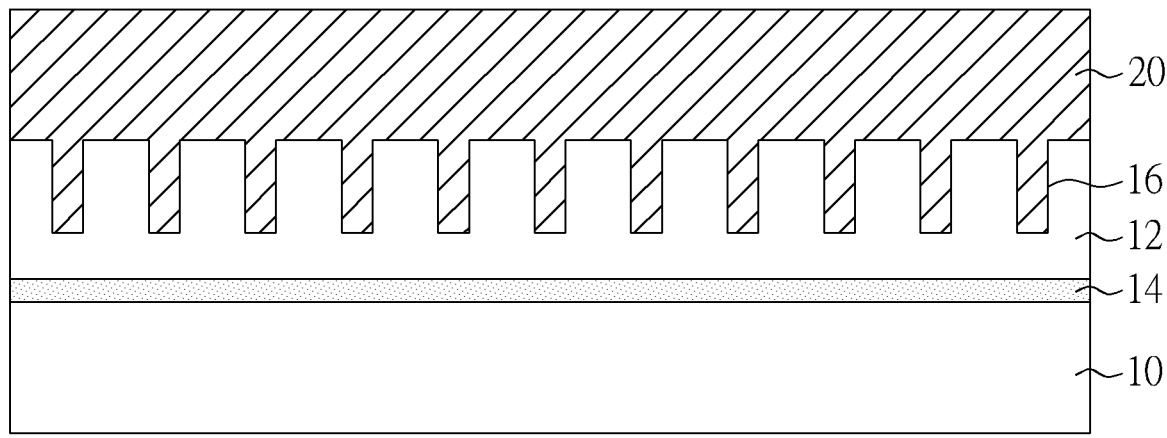
Figure 3:
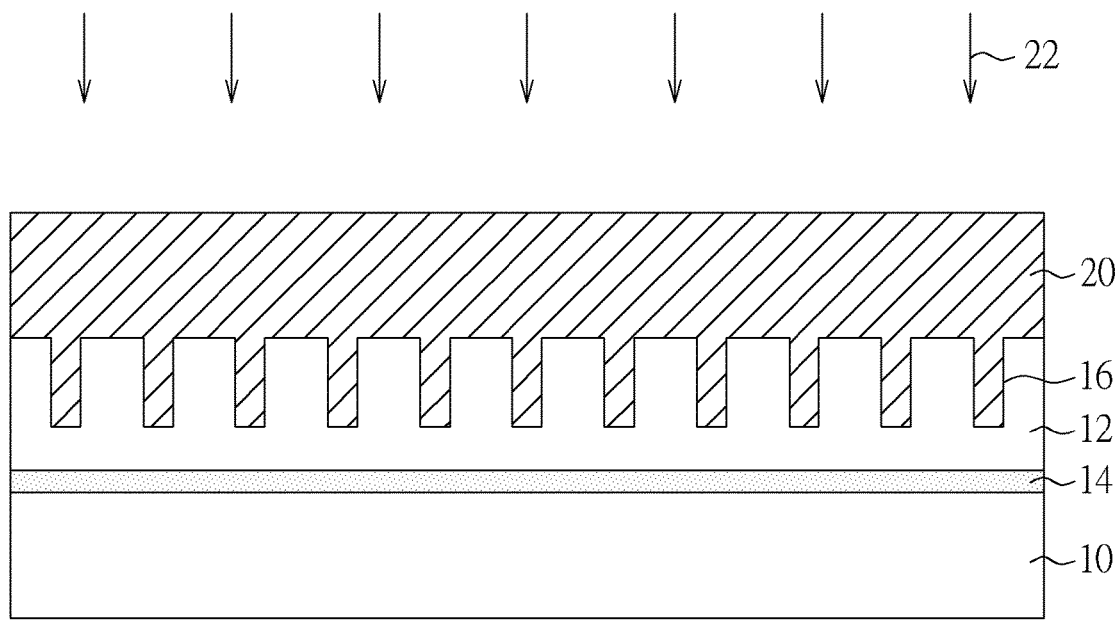
Figure 4:
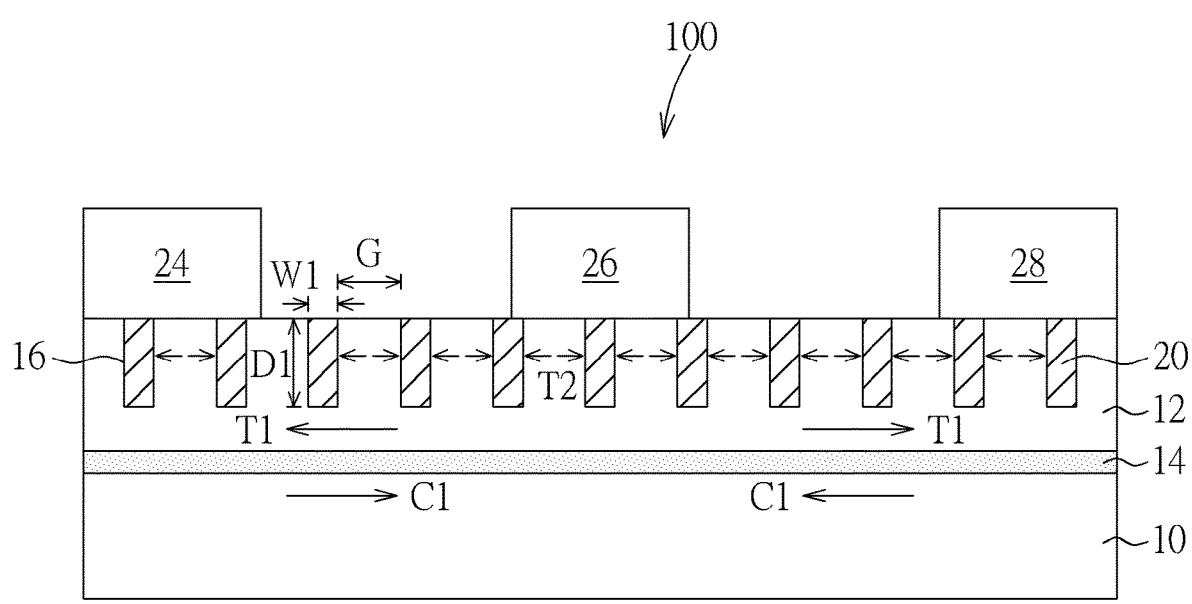

As shown in FIG. 2, at least one trench 16 is formed in the aluminum gallium nitride layer 12. Based on different requirements, numerous trenches 16 can be formed. This embodiment takes eleven trenches as an example. Next, a flowable chemical vapor deposition (FCVD) 18 is performed to form a silicon oxide layer 20 to fill the trenches 16 and cover the aluminum gallium nitride layer 12. As shown in FIG. 3, a thermal process 22 is performed to cure the silicon oxide layer 20. As shown in FIG. 4, the silicon oxide layer 20 is planarized to make a top surface of the silicon oxide layer 20 align with a top surface of the aluminum gallium nitride layer 12. The silicon oxide layer 20 may be planarized by a chemical mechanical planarization process. After that, a source electrode 24, a gate electrode 26 and a drain electrode 28 are formed on the aluminum gallium nitride layer 12. The gate electrode 26 is between the source electrode 24 and the drain electrode 28. At this point, an HEMT 100 is completed.

Figure 10:
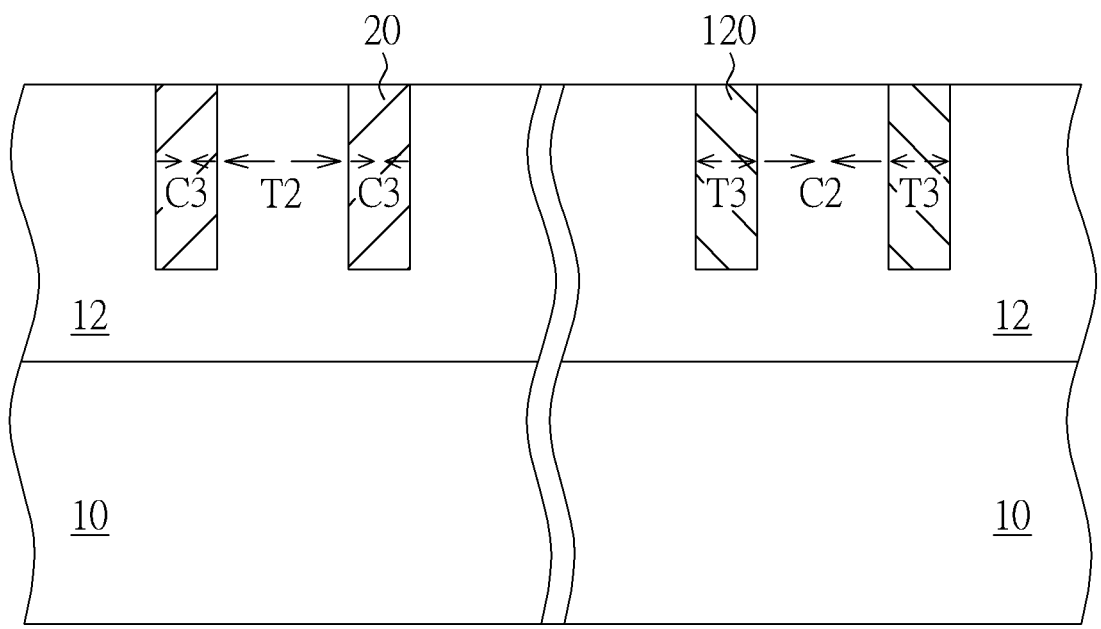
FIG. 10 depicts a compressive stress in a silicon oxide layer and a tensile stress in a stressor.

FIG. 10 depicts a compressive stress in a silicon oxide layer and a tensile stress in a stressor. For the sake of clarity, only the gallium nitride layer 10, the aluminum gallium nitride layer 12, the silicon oxide layer 20 and a stressor 120 are shown, and other elements are omitted.

Please refer to FIG. 4 and FIG. 10. Because the silicon oxide layer 20 is formed by the FCVD 18, the silicon oxide layer 20 includes a compressive stress C3. Therefore, the aluminum gallium nitride layer 12 around the silicon oxide layer 20 is influenced by the compressive stress C3 to contain a tensile stress T2. After the silicon oxide layer 20 is formed in the aluminum gallium nitride layer 12, the tensile stress of the aluminum gallium nitride layer 12 becomes the tensile stress T1 pluses the tensile stress T2. The increase of the tensile stress of the aluminum gallium nitride layer 12 raises the piezoelectricity, thereby increasing the electron density of the 2DEG 14. The end result is that the operating efficiency of the HEMT 100 is also enhanced. At this point, a method of adjusting an electron density of a 2DEG is completed.

FIG. 4 depicts an HEMT according to a second preferred embodiment of the present invention. The HEMT 100 is a normally-on HEMT. The HEMT 100 includes a gallium nitride layer 10. An aluminum gallium nitride layer 12 is disposed on the gallium nitride layer 10. The aluminum gallium nitride layer 12 includes a tensile stress T1. The gallium nitride layer 10 includes a compressive stress C1. A source electrode 24 and a drain electrode 28 are disposed on the aluminum gallium nitride layer 12. A gate electrode 26 is disposed on the aluminum gallium nitride layer 12 between the source electrode 24 and the drain electrode 28. At least one silicon oxide layer 20 is embedded in the aluminum gallium nitride layer 12. The thickness D1 of the silicon oxide layer 20 is not larger than the thickness of the aluminum gallium nitride layer 12. Moreover, a top surface of the silicon oxide layer 20 is aligned with a top surface of the aluminum gallium nitride layer 12. The silicon oxide layer 20 can be disposed in the aluminum gallium nitride layer 12 directly under the source electrode 24, in the aluminum gallium nitride layer 12 directly under the drain electrode 28, or in the aluminum gallium nitride layer 12 between the aluminum gallium nitride layer 12 directly under the source electrode 24 and the aluminum gallium nitride layer 12 directly under the drain electrode 28. This embodiment takes numerous silicon oxide layers 20 disposed from the aluminum gallium nitride layer 12 directly under the source electrode 24 to the aluminum gallium nitride layer 12 directly under the drain electrode 28 as an example.

It is noteworthy that the silicon oxide layer 20 is formed by the FCVD 18; therefore, the silicon oxide layer 20 contains a compressive stress. After the silicon oxide layer 20 is embedded into the aluminum gallium nitride layer 12, the tensile stress in the aluminum gallium nitride layer 12 can be increased. The aspect ratio of the silicon oxide layer is between 0.5 and 5. The gap G between the adjacent silicon oxide layers 20 is between 0.2 and 200 times of the width W1 of one of the silicon oxide layers 20. For example, the thickness D1 of one of the silicon oxide layer 20 is about 50 nanometers. The width W1 of one of the silicon oxide layer 20 is between 10 and 100 nanometers. The gap G between the adjacent silicon oxide layers 20 is between 20 and 2000 nanometers. According to different sizes of the HEMT 100, the electron density of the 2DEG; the size, the gap, or the thickness of the silicon oxide layer 20 can be changed.

Figure 5:
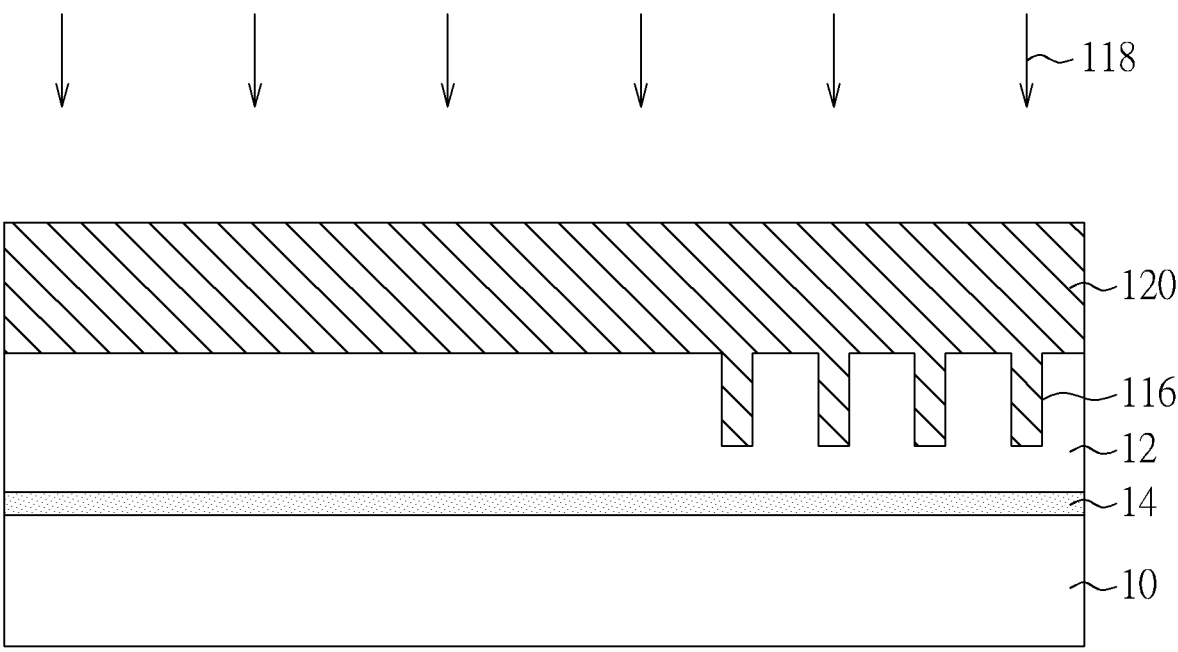
Figure 6:
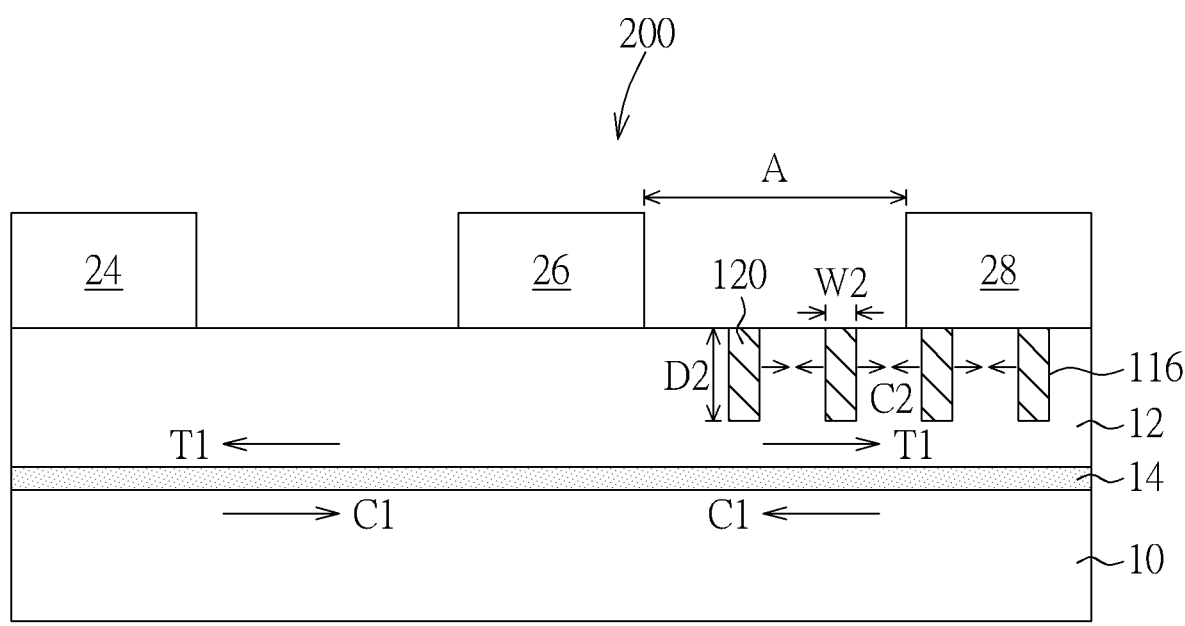

FIG. 5 to FIG. 6 depict a method of adjusting an electron density of a 2DEG according to a third embodiment of the present invention, wherein like reference numerals are used to refer to like elements in the first preferred embodiment.

As shown in FIG. 1, a gallium nitride layer 10 is provided. Next, an aluminum gallium nitride layer 12 is formed to cover and contact the gallium nitride layer 10. As shown in FIG. 5, at least one trench 116 is formed in the aluminum gallium nitride layer 12. In this embodiment, numerous trenches 116 are shown as an example. Then, a chemical vapor deposition process 118 is performed to form a stressor 120 to fill the trenches 116. The stressor 120 can be silicon oxide, silicon nitride or other material layers which can contain stress. As shown in FIG. 6, the stressor 120 is planarized to make a top surface of the stressor 120 align with a top surface of the aluminum gallium nitride layer 12. After that, a source electrode 24, a gate electrode 26 and a drain electrode 28 are formed on the aluminum gallium nitride layer 12. The gate electrode 26 is between the source electrode 24 and the drain electrode 28. At this point, an HEMT 200 is completed.

Please refer to FIG. 6 and FIG. 10. The stressor 120 contains a tensile stress T3; therefore, the aluminum gallium nitride layer 12 around the stressor 120 is influenced by the tensile stress T3 to contain a compressive stress C2. In this way, the tensile stress of the aluminum gallium nitride layer 12 becomes the tensile stress T1 minus the value of the compressive stress C2. The piezoelectricity is decreased, and the electron density of the 2DEG 14 is also decreased. At this point, another method of adjusting an electron density of the 2DEG is completed.

Because the HEMT 200 works at a high voltage, a great amount of sudden discharge often occurs at the tip of the gate electrode 26, deteriorating the HEMT 200. The present invention utilizes stressors 120 to make the electron density of the 2DEG 14 decrease. When the electron density is lowered, the resistivity is raised. In this way, even when a high voltage is applied to the HEMT 200, the voltage is decreased slowly, and a sudden high current conduction can be prevented.

FIG. 6 depicts an HEMT according to a fourth preferred embodiment of the present invention, wherein like reference numerals are used to refer to like elements in the first preferred embodiment. The HEMT 200 is a normally-on HEMT. The HEMT 200 includes a gallium nitride layer 10. An aluminum gallium nitride layer 12 is disposed on the gallium nitride layer 10. The aluminum gallium nitride layer 12 includes a tensile stress T1. The gallium nitride layer 10 includes a compressive stress C1. A source electrode 24 and a drain electrode 28 are disposed on the aluminum gallium nitride layer 12. A gate electrode 26 is disposed on the aluminum gallium nitride layer 12 between the source electrode 24 and the drain electrode 28. At least one stressor 120 is embedded in the aluminum gallium nitride layer 12. The stressor 120 decreases the tensile stress T1 in the aluminum gallium nitride layer 12. The thickness D2 of the stressor 120 is smaller than the thickness of the aluminum gallium nitride layer 12. Moreover, a top surface of the stressor 120 is aligned with a top surface of the aluminum gallium nitride layer 12. The stressor 120 can be disposed in the aluminum gallium nitride layer 12 directly under the gate electrode 26, in the aluminum gallium nitride layer 12 directly under the drain electrode 28, or in the aluminum gallium nitride layer 12 between the aluminum gallium nitride layer 12 directly under the gate electrode 26 and the aluminum gallium nitride layer 12 directly under the drain electrode 28. The stressor 120 is preferably closer to the drain electrode 28 and farther from the gate electrode 26. This embodiment takes numerous stressors 120 disposed at the aluminum gallium nitride layer 12 closer to the drain electrode 28 as an example.

According to a preferred embodiment of the present invention, the distance A between the gate electrode 26 and the drain electrode 28 is more than 233 times of a thickness D2 of the stressor 120. The ratio of the distance A to a width W2 of the stressor 116 is between 14 and 140. For example, when the distance A between the gate electrode 26 and the drain electrode 28 is about 7 micrometers, the thickness D2 of each of the stressors 120 is smaller than 30 nanometers. The width W2 of each of the stressors 120 is between 50 and 500 nanometers. According to different sizes of the HEMT 200 or the voltage applied to the HEMT 200, the size, or the thickness of the stressor 120 can be changed.

Figure 7:
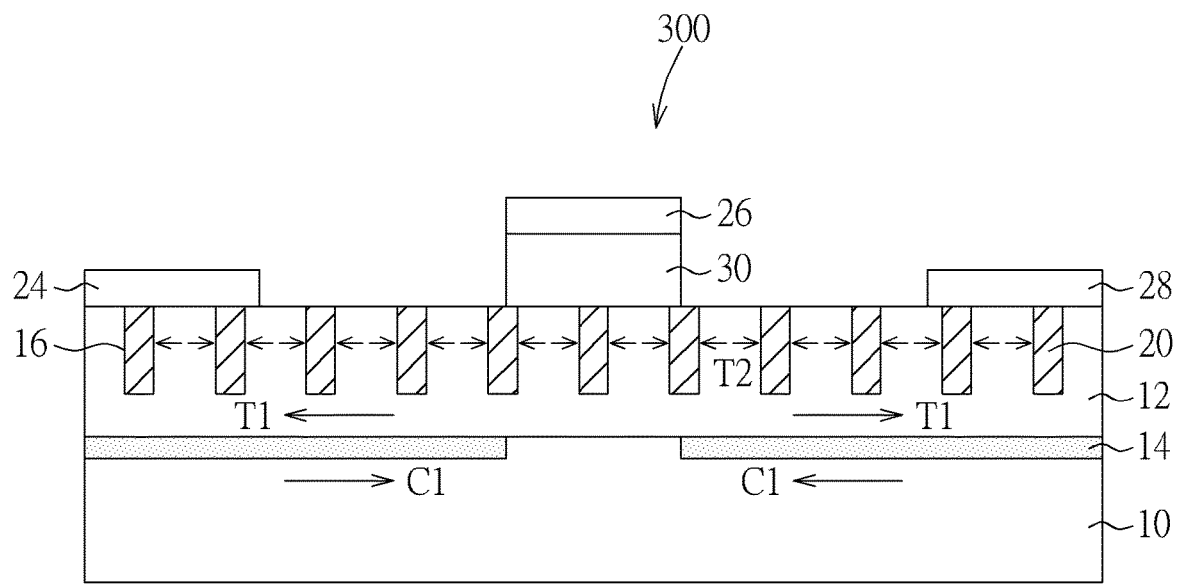
Figure 8:
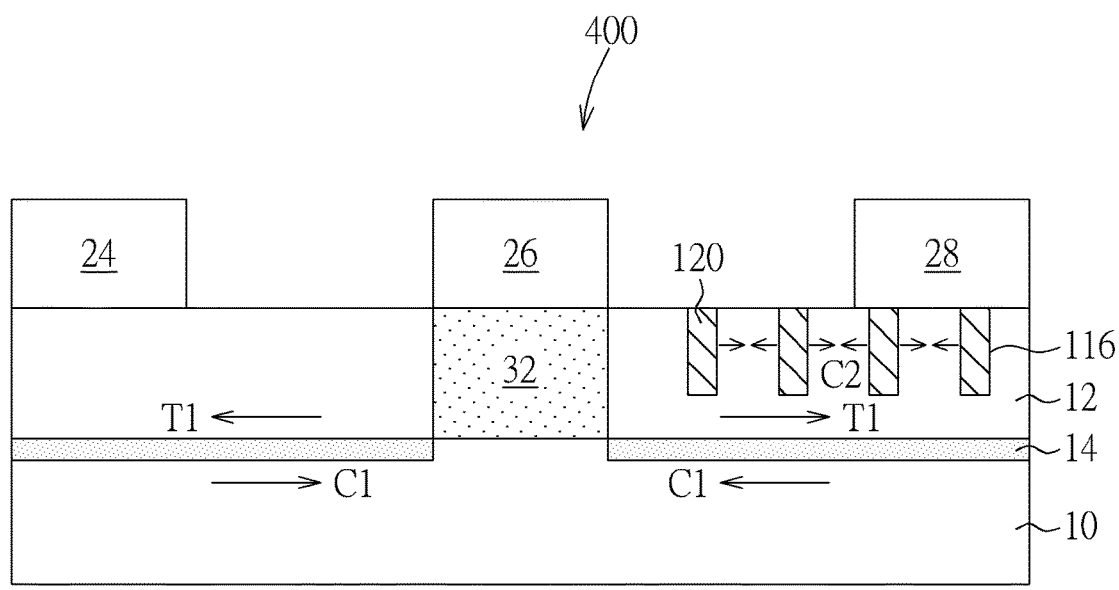
Figure 9:
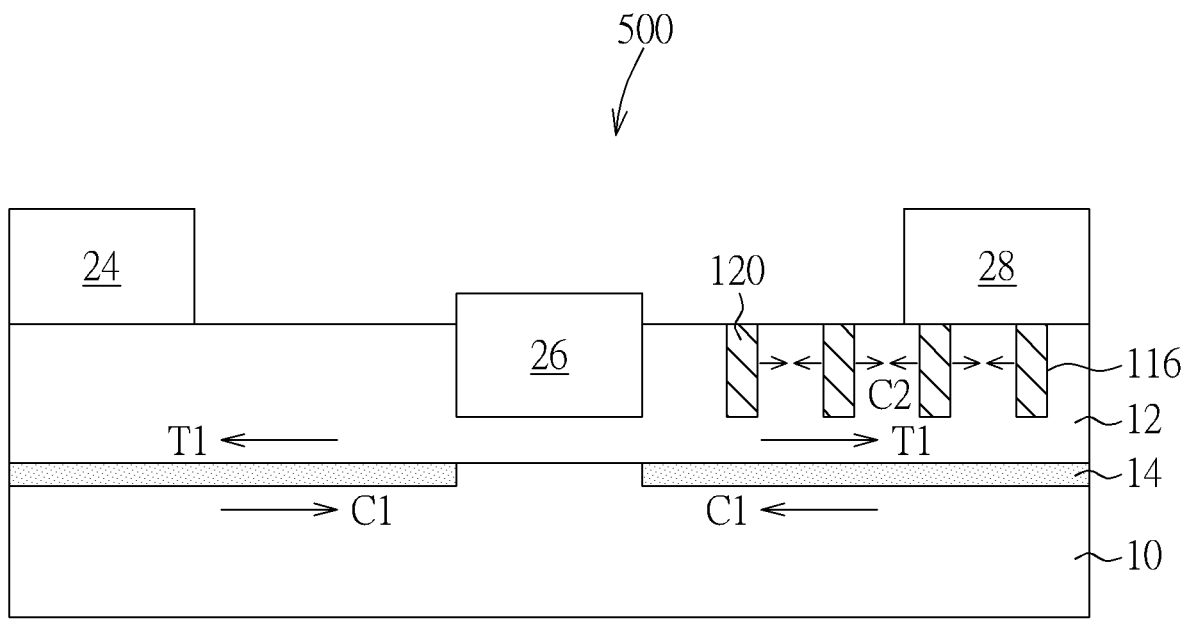

FIG. 7 to FIG. 9 depict a method of adjusting an electron density of a 2DEG according to another preferred embodiment of the present invention, wherein like reference numerals are used to refer to like elements in the first preferred embodiment and the third preferred embodiment. The method of adjusting an electron density of a 2DEG of the present invention can be applied to normally-on HEMTs and normally-off HEMTs.

As shown in FIG. 7, the HEMT 300 is a normally-off HEMT. The difference between the HEMT 100 in FIG. 4 and the HEMT 300 in FIG. 7 is that the HEMT 300 includes a P-type gallium nitride layer 30. Moreover, the normally-off HEMT liked the HEMT 300 can use the silicon oxide layer 20 shown in this embodiment to increase the electron density of the 2DEG 14, or use the stressor 120 shown in FIG. 6 to decrease the electron density of the 2DEG 14.

As shown in FIG. 8, the HEMT 400 is a normally-off HEMT. The difference between the HEMT 100 in FIG. 6 and the HEMT 400 in FIG. 8 is that the HEMT 400 includes a fluorine doped area 32 within the aluminum gallium nitride layer 12. Moreover, the normally-off HEMT liked the HEMT 400 can use the stressor 120 shown in this embodiment to decrease the electron density of the 2DEG 14 or use the silicon oxide layer 20 shown in FIG. 4 to increase the electron density of the 2DEG 14.

As shown in FIG. 9, the HEMT 500 is a normally-off HEMT. The difference between the HEMT 100 in FIG. 6 and the HEMT 500 in FIG. 9 is that the gate electrode 26 of the HEMT 500 is embedded within the aluminum gallium nitride layer 12. Moreover, the normally-off HEMT liked the HEMT 500 can use the stressor 120 shown in this embodiment to decrease the electron density of the 2DEG 14 or use the silicon oxide layer 20 shown in FIG. 4 to increase the electron density of the 2DEG 14.

The present invention increases the electron density of the 2DEG by embedding the silicon oxide layer formed by the FCVD to raise the efficiency of the HEMT. Furthermore, the present invention decreases the electron density of the 2DEG by embedding stressors to increase the ability of the HEMT for sustaining high voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a gallium nitride layer;
   an aluminum gallium nitride layer disposed on the gallium nitride layer, wherein the aluminum gallium nitride layer comprises a tensile stress;
   a source electrode and a drain electrode disposed on the aluminum gallium nitride layer;
   a gate electrode disposed on the aluminum gallium nitride layer between the source electrode and the drain electrode; and
   a plurality of silicon oxide layers embedded in the aluminum gallium nitride layer, wherein each of the plurality of silicon oxide layers is free from protruding a top surface of the aluminum gallium nitride layer, sizes of the plurality of silicon oxide layers are the same, the plurality of silicon oxide layers are formed by a flowable chemical vapor deposition, and each of the plurality of silicon oxide layers increases the tensile stress in the aluminum gallium nitride layer.

2. The HEMT of claim 1, wherein a top surface of each of the silicon oxide layers is aligned with the aluminum gallium nitride layer.

3. The HEMT of claim 1, wherein one of the plurality of silicon oxide layers is disposed in the aluminum gallium nitride layer directly under the source electrode, in the aluminum gallium nitride layer directly under the drain electrode, or in the aluminum gallium nitride layer between the aluminum gallium nitride layer directly under the source electrode and the aluminum gallium nitride layer directly under the drain electrode.

4. The HEMT of claim 1, wherein each of the plurality of silicon oxide layers comprises a compressive stress.

5. The HEMT of claim 1, wherein a thickness of each of the plurality of silicon oxide layers is not larger than a thickness of the aluminum gallium nitride layer.

6. A high electron mobility transistor (HEMT) comprising:
   a gallium nitride layer;
   an aluminum gallium nitride layer disposed on the gallium nitride layer, wherein the aluminum gallium nitride layer comprises a tensile stress;
   a source electrode and a drain electrode disposed on the aluminum gallium nitride layer;
   a gate electrode disposed on the aluminum gallium nitride layer between the source electrode and the drain electrode; and
   at least one stressor embedded in the aluminum gallium nitride layer, wherein the stressor decreases the tensile stress in the aluminum gallium nitride layer.

7. The HEMT of claim 6, wherein a top surface of the stressor is aligned with the aluminum gallium nitride layer.

8. The HEMT of claim 6, wherein the stressor is disposed in the aluminum gallium nitride layer directly under the drain electrode, in the aluminum gallium nitride layer directly under the gate electrode, or in the aluminum gallium nitride layer between the aluminum gallium nitride layer directly under the gate electrode and the aluminum gallium nitride layer directly under the drain electrode.

9. The HEMT of claim 8, wherein the stressor is closer to the drain electrode and farther from the gate electrode.

10. The HEMT of claim 6, further comprising a plurality of the stressors embedded in the aluminum gallium nitride layer.

11. The HEMT of claim 6, wherein the stressor comprises a tensile stress.

12. The HEMT of claim 6, wherein the stressor is silicon oxide or silicon nitride.

13. The HEMT of claim 6, wherein the stressor is a silicon oxide formed by a chemical vapor deposition process.

14. The HEMT of claim 6, wherein a thickness of the stressor is smaller than a thickness of the aluminum gallium nitride layer.

15. A method of adjusting an electron density of a two-dimensional electron gas (2DEG), comprising:
   providing a gallium nitride layer and an aluminum gallium nitride layer, wherein the aluminum gallium nitride layer contacts the gallium nitride layer, a source electrode, a drain electrode and a gate electrode are disposed on the aluminum gallium nitride layer, the aluminum gallium nitride layer comprises a tensile stress, and the 2DEG is formed within the gallium nitride layer; and
   performing a step selected from step A and step B, wherein:
   Step A comprises forming at least one silicon oxide layer embedded in the aluminum gallium nitride layer, wherein the silicon oxide layer is formed by a flowable chemical vapor deposition, the silicon oxide layer increases the tensile stress in the aluminum gallium nitride layer and increases an electron density of the 2DEG;
   Step B comprises forming at least one stressor embedded in the aluminum gallium nitride layer, wherein the stressor decreases the tensile stress in the aluminum gallium nitride layer and decreases the electron density of the 2DEG.

16. The method of adjusting an electron density of a 2DEG of claim 15, wherein the silicon oxide layer is disposed in the aluminum gallium nitride layer directly under the source electrode, in the aluminum gallium nitride layer directly under the drain electrode, or in the aluminum gallium nitride layer between the aluminum gallium nitride layer directly under the source electrode and the aluminum gallium nitride layer directly under the drain electrode.

17. The method of adjusting an electron density of a 2DEG of claim 9, wherein the stressor is disposed in the aluminum gallium nitride layer directly under the drain electrode, in the aluminum gallium nitride layer directly under the gate electrode, or in the aluminum gallium nitride layer between the aluminum gallium nitride layer directly under the gate electrode and the aluminum gallium nitride layer directly under the drain electrode.

18. The method of adjusting an electron density of a 2DEG of claim 15, wherein steps of fabricating the silicon oxide layer comprise:
   forming a trench in the aluminum gallium nitride layer;
   performing a flowable chemical vapor deposition to form the silicon oxide layer in the trench;
   curing the silicon oxide layer by a thermal process; and
   planarizing the silicon oxide layer to make a top surface of the silicon oxide layer align with a top surface of the aluminum gallium nitride layer.

19. The method of adjusting an electron density of a 2DEG of claim 15, wherein steps of fabricating the stressor comprise:
   forming a trench in the aluminum gallium nitride layer;
   performing a chemical vapor deposition process to form the stressor in the trench; and
   planarizing the stressor to make a top surface of the stressor align with a top surface of the aluminum gallium nitride layer.

* * * * *